United States Patent [19]
Siegel et al.

[11] Patent Number: 5,896,045
[45] Date of Patent: Apr. 20, 1999

[54] STATIC PULSED CROSS-COUPLED LEVEL SHIFTER AND METHOD THEREFOR

[76] Inventors: Joshua Siegel, 1718 A Rockbridge Terrace, Austin, Tex. 78741; Hector Sanchez, 2010 Bent Bow Cove, Cedar Park, Tex. 78613; Chai-Chin Chao, 7202 Rain Creek Parkway, Austin, Tex. 78759

[21] Appl. No.: 08/851,261

[22] Filed: May 5, 1997

[51] Int. Cl.$^6$ ............................... H03K 19/094
[52] U.S. Cl. ............................... 326/81; 326/68
[58] Field of Search ........................... 326/83, 86, 68, 326/80, 81, 9, 121

[56] References Cited

U.S. PATENT DOCUMENTS

| | | | |
|---|---|---|---|
| 4,797,838 | 1/1989 | Nelson et al. | 326/29 |
| 5,216,300 | 6/1993 | Wabuka | 326/86 |
| 5,266,849 | 11/1993 | Kitahara. | |

*Primary Examiner*—Michael Tokar
*Assistant Examiner*—Qui Van Duong
*Attorney, Agent, or Firm*—Robert L. King

[57] ABSTRACT

Level shifting circuit (36) utilizes self-timed pulse generators (40, 46) to provide a series of pulses in response to an input signal. The pulses are used to create a pulse of specified duration at a predetermined voltage level at first and second nodes (44, 45). In response to the predetermined pulses, shifted inverters (50, 52) provide a voltage output of either $V_{DDH}$ or $V_{DDL}$, one of two different voltages which exist in a system utilizing the level shifter (36). In one form, level shifting circuit (36) may be used in an output buffer (60) to interface an integrated circuit designed to operate at a low supply voltage with additional integrated circuits operating at a higher supply voltage which could damage the gate oxide of the transistors in the low supply voltage integrated circuit.

14 Claims, 3 Drawing Sheets

STATIC PULSED CROSS-COUPLED LEVEL SHIFTER AND METHOD THEREFOR

CROSS REFERENCE TO RELATED APPLICATION

This application is related to copending U.S. patent application Ser. No. 08/757,978 entitled "Circuitry and Method for Translating Voltages" filed by International Business Machines Corporation on Nov. 27, 1996.

TECHNICAL FIELD

This invention relates to semiconductor circuits, and more particularly, to static design voltage level shifting circuits.

BACKGROUND OF THE INVENTION

Semiconductor technologies continuously evolve such that leading edge semiconductors have decreased geometries of transistor sizes and decreased voltages for voltage supplies. The smaller transistors are now manufactured with very thin gate oxide material. As a result, the dielectric breakdown voltage for such transistors in the leading edge semiconductor products has decreased. Thus, the decreased voltage supply is both desirable in order to reduce power consumption and necessary in order to avoid damaging the very thin gate oxide material. Other semiconductor products coupled to the leading edge semiconductor products still have much higher breakdown voltage devices, and utilize higher supply voltages. For many years, semiconductor designers have dealt with the problem of translating between various levels of supply voltages. For example, when technology transferred between TTL (transistor to transistor logic) to MOS technology there was a need for voltage level shifting to be performed between the TTL and MOS technologies. Additionally, as supply voltages gradually decreased from 15 volts to 5 volts to 3 volts, designers created interface circuits which could operate between different voltage systems. However, most of those designs were focused on the issue of being able to just interface between one system operating at one voltage and a second system operating at a different voltage. Such systems typically did not have the problem of coping with breakdown voltages of transistors being threatened by the higher voltage system.

Some known voltage level shifters inherently consume DC power. That is, DC power is continuously consumed. As a result, such voltage level shifters are not acceptable for low power microprocessor designs, as well as other leading edge semiconductors which either require low power consumption or which address low power applications.

Because there are many chips and integrated circuits such as memories, memory controllers, and other peripherals that work with leading edge microprocessors, such peripherals and memories have not changed their supply voltages or reduced their voltage levels nearly as quickly as microprocessors have. In being able to interface between a peripheral circuit that has a much higher voltage than a leading edge integrated circuit, such as a microprocessor, designers often use a well biasing technique to try to minimize the impact in an integrated circuit of receiving a voltage signal much higher than the supply voltage intended for that integrated circuit. The well bias technique which is used eliminates a charge drain from the output node to an output stage power supply within the circuit. Prior circuits typically dealt with receiving higher voltage levels and using those voltage levels in a system operating at a lower voltage level. However, such systems did not typically worry about or have to compensate for transistor damage due to thin gate oxides. As technologies have evolved, the maximum voltage permitted across a transistor has decreased much faster than the decrease of supply voltages for the output bus. Therefore, a need exists for a circuit and method which is able to guarantee the integrity of transistors and transistor gate oxides when interfacing with very high supply voltages at the output bus. A known circuit for dealing with protecting gate oxides when coupling to an output bus having a higher supply voltage than the circuit supply voltage is illustrated in FIG. 1. An output buffer 10 has an input portion 11, an intermediate portion 12, and an output portion 13. In input portion 11, a p-channel transistor 15 has a source connected to a power supply voltage VDDH, a gate connected to a node 24, and a drain connected to a node 17. A p-channel transistor 18 has a source connected to the supply voltage VDDH, and a gate connected a drain thereof at node 17. An n-channel transistor 20 has a drain connected to node 17, a gate connected to supply voltage $V_{DDL}$, and a source connected to a drain of an n-channel transistor 21. A gate of transistor 21 is connected to the data input terminal, and a source of transistor 21 is connected to a ground terminal. Intermediate portion 12 has an inverter 23 and an inverter 26 connected via a node 24 which is also connected to the gate of transistor 15. Inverters 23 and 26 are connected between supply voltage $V_{DDH}$ and supply $V_{DDL}$. The output portion 13 comprises p-channel transistors 28 and 29 and n-channel transistors 31 and 32. P-channel transistor 28 has a source connected to supply voltage $V_{DDH}$, a gate connected to the output of inverter 26, and a drain connected to a source of transistor 29. Transistor 29 has a gate connected to supply voltage $V_{DDL}$, and a drain connected to a chip output terminal. N-channel transistor 31 has a drain connected to the chip output terminal, a gate connected to supply voltage $V_{DDL}$, and a source connected to a drain of n-channel transistor 32. Transistor 32 has a gate connected to the complement of the "Data Input" signal, and has a source connected to the ground terminal.

In operation, circuit 10 is an output buffer with an input portion 11 which consumes DC power. Input portion 11 functions as a level shift stage. When the input data has a logic high level, node 17 is driven low by the input portion 11. However, node 17 does not assume a ground level potential, but rather node 17 is at a level which is driven below $V_{DDL}$. Once node 17 is driven below $V_{DDL}$, the first inverter 23 drives node 24 to the $V_{DDH}$ supply level. As a result, inverter 26 transitions the gate of transistor 28 to $V_{DDL}$ so that transistor 28 is made conductive. As a result, the chip output terminal is driven to the $V_{DDH}$ value. In the illustrated form, $V_{DDL}$ is a lower voltage magnitude than $V_{DDH}$, and $V_{DDH}$ exceeds the maximum permitted voltage of the gate-to-source voltage, $V_{GS}$, of each of the transistors of buffer 10. However, the difference between the $V_{DDH}$ voltage level and the $V_{DDL}$ voltage level is less than the maximum gate-to-source/drain voltage allowed in the technology in which buffer 10 is implemented.

When the data input is at a logic low level, transistor 21 isolates node 17 from the ground terminal, and node 17 transitions to the $V_{DDH}$ potential. As a result, inverter 23 transitions node 24 to supply voltage $V_{DDL}$ and inverter 26 transitions the gate of transistor 28 to $V_{DDH}$ which makes transistor 28 non-conductive. Furthermore, transistor 32 is conductive and thus the chip output signal transitions to the ground terminal potential. In summary, output buffer 10 operates to consume power in the input portion 11 when the input data signal is true. When the input data signal is not true, power is not consumed. Although the power consumption of output buffer 10 is a potential problem for many applications, output buffer 10 functions to allow the circuit to interface with a system having a higher supply voltage. Additionally, output buffer 10 does not permit a voltage between the gate to source electrodes of each transistor which would destroy the gate oxide of that transistor.

DETAILED DESCRIPTION OF THE INVENTION

Figure 1:
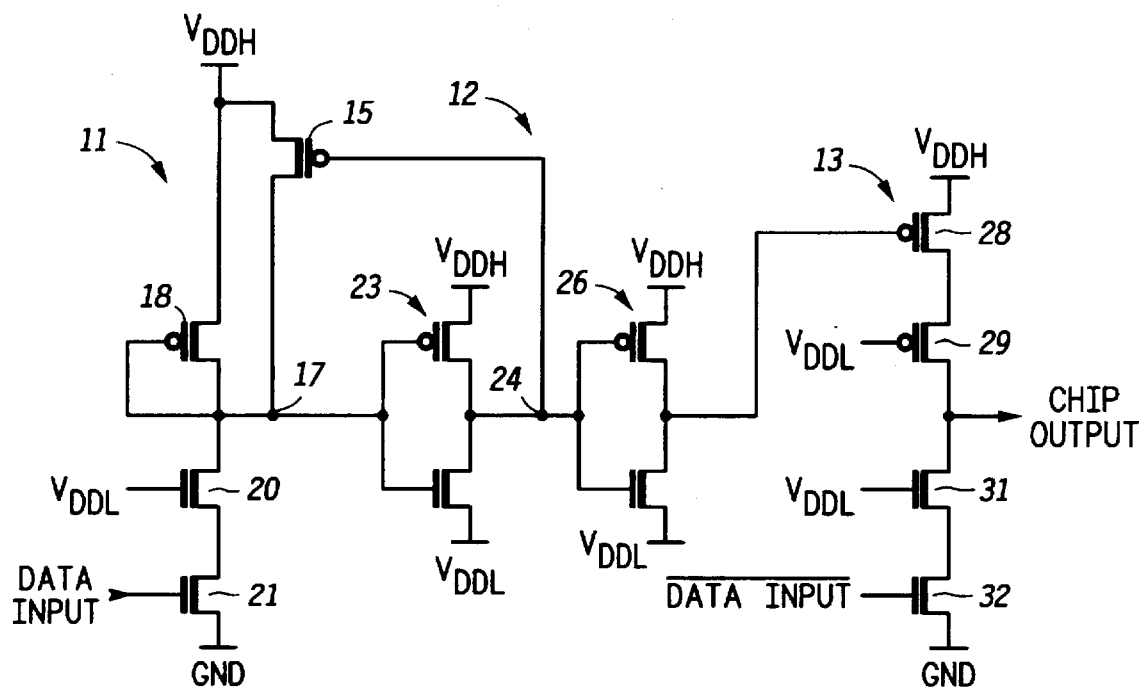
FIG. 1 illustrates in schematic form a known output buffer for interfacing between two supply voltages of differing magnitude.
Figure 2:
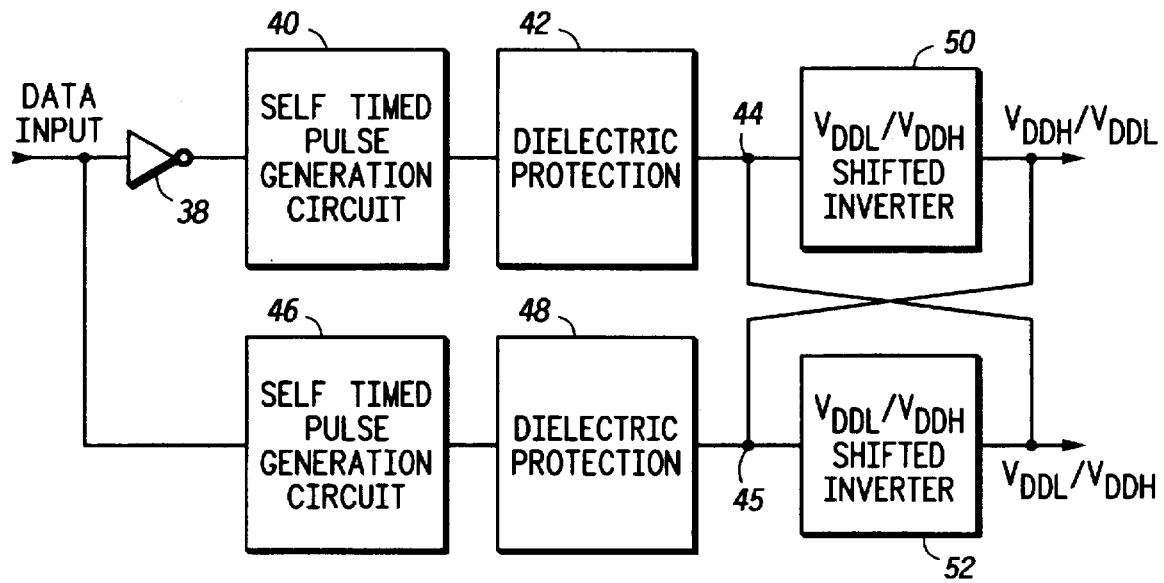
FIG. 2 illustrates in block diagram form a level shifter in accordance with the present invention.

Illustrated in FIG. 2 in block diagram form is a level shift circuit 36 in accordance with the present invention. A data input terminal is connected to an input of an inverter 38 having an output connected to an input of a self-timed pulse generation circuit 40. The data input is also connected to an input of a self-timed pulse generation circuit 46. Pulse generation circuit 40 has an output connected to a dielectric protection circuit 42 and pulse generation circuit 46 has an output connected to an input of dielectric protection circuit 48. An output of dielectric protection circuit 42 is connected to an input of a $V_{DDL}/V_{DDH}$ shifted inverter 50 at a node 44. In the illustrated form, the terms "$V_{DDL}$" and "$V_{DDH}$" are designating a low and a high magnitude of $V_{DD}$ supply voltage. An output of dielectric protection circuit 48 is connected to an input of a $V_{DDL}/V_{DDH}$ shifted inverter 52 at a node 45. Shifted inverters 50 and 52 are cross-coupled, meaning that the output of shifted inverter 50 is also connected to the input of inverter 52 at node 45 and the output of shifted inverter 52 is connected to the input of shifted inverter 50 at node 44. The output of shifted inverter 50 provides a signal labeled $V_{DDH}/V_{DDL}$ and the output of shifted inverter 52 provides an output labeled $V_{DDL}/V_{DDH}$. The output of shifted inverter 50 is the inversion of the data input terminal and the output of shifted inverter 52 is the true form of data input. Also, the outputs of shifted inverters 50 and 52 are respectively $V_{DDH}$ and $V_{DDL}$, or vice versa. Pulse generation circuits 40 and 46 each provide a pulse width of predetermined width at nodes 44 and 45. The pulse width is guaranteed to be long enough in order to allow shifted inverters 50 and 52 to provide $V_{DDH}$ and $V_{DDL}$ at their respective outputs. Self-timed pulse generation circuit 40 provides a pulse of predetermined width and magnitude to guarantee that the outputs of shifted inverters 50 and 52 transition as they should to $V_{DDH}$ and $V_{DDL}$. Due to the presence of inverter 38, self-timed pulse generation circuits 40 and 46 function to operate on opposite phases of the input data, respectively. Dielectric protection circuits 42 and 48 exist to limit the gate-to-source/drain voltage of the transistors of the self-timed pulse generation circuits 40 and 46 as will be further described in connection with FIG. 3. Also, circuits 42 and 48 function to limit the drain-to-source voltage of the transistors of the self-timed pulse generation circuits 40 and 46.

Figure 3:
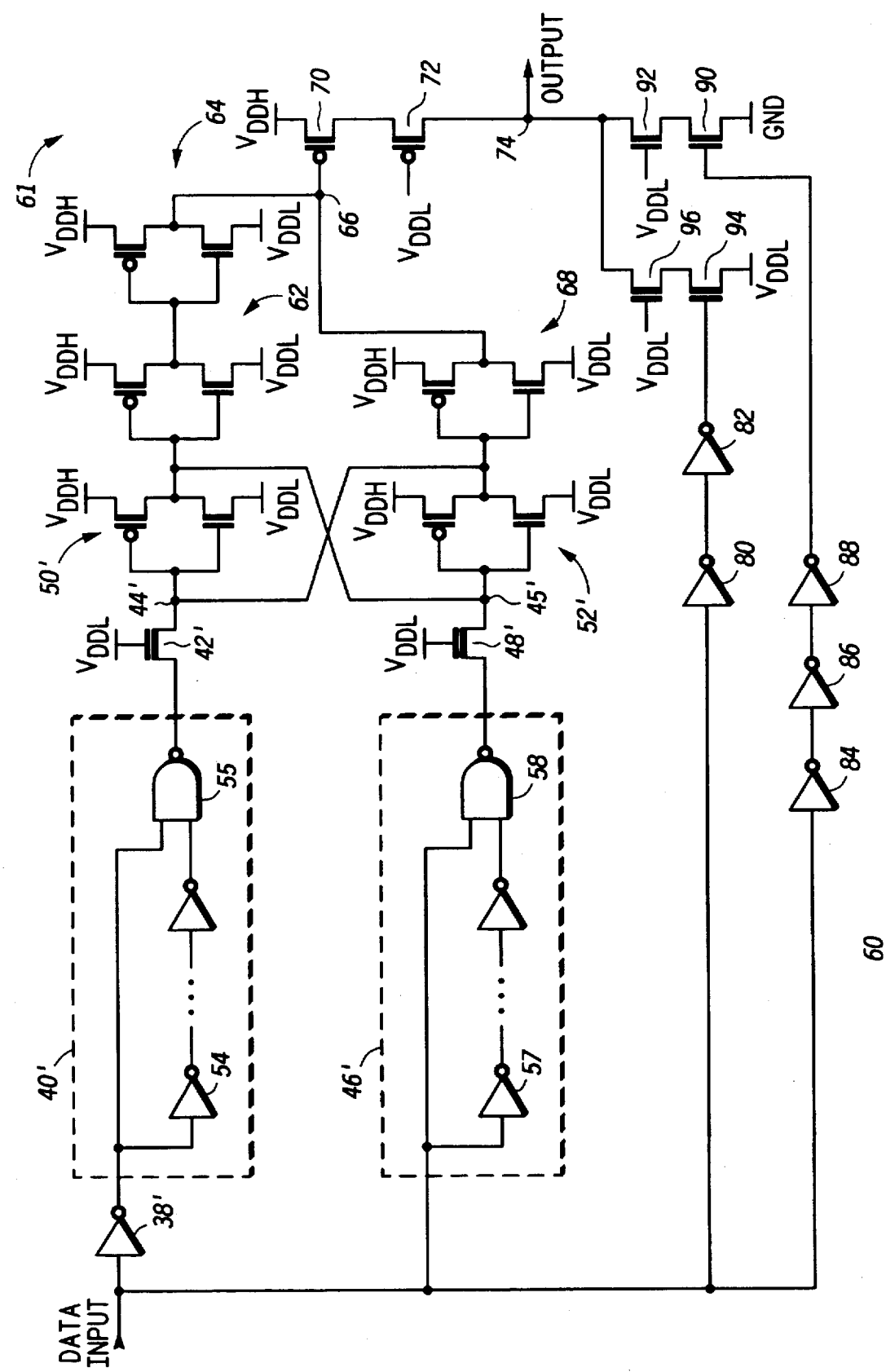
FIG. 3 illustrates in schematic form an output buffer having a level shifter in accordance with the present invention.

Illustrated in FIG. 3 is an implementation of the level shifting circuit 36 of FIG. 2 combined with circuitry which implements an output buffer 60. For purposes of comparison of the common elements of FIG. 2 and FIG. 3, analogous elements are numbered with a prime in FIG. 3. In the illustrated form, a data input terminal, labeled "Data Input", receives input data and is connected to an input of an inverter 38'. An output of inverter 38' is connected to a self-timed pulse generation circuit 40 prime. Self-timed pulse generation circuit 40' has an odd number of inverters, such as inverter 54, etc., connected in series. The output of the last inverter in the series of inverters is connected to a first input of a NAND gate 55. The output of inverter 38 is also connected to a second input of NAND gate 55. An output of NAND gate 55 is connected to a drain of a dielectric protection transistor 42'. Dielectric protection transistor 42' has a gate connected to a low supply voltage $V_{DDL}$. Transistor 42' also has a source connected to both an input of a shifted inverter 50' and to an output of a shifted inverter 52'. The data input terminal is also connected to an input of a second self-timed pulse generation circuit 46'. Pulse generation circuit 46' also has an odd number of series connected inverters, such as inverter 57, etc. An output of a last series-connected inverter is connected to a first input of a NAND gate 58. The data input terminal is also connected to a second input of NAND gate 58. NAND gate 58 has an output connected to a drain of a dielectric protection transistor 48'. Dielectric protection transistor 48' has a gate connected to the low supply voltage $V_{DDL}$, and transistor 48' has a source connected to both the output of shifted inverter 50' and the input of shifted inverter 52'. Each of shifted inverters 50' and 52' has a series-connected p-channel and n-channel transistor which function in a conventional manner as an inverter. It should be well understood that other circuit implementations which perform the function of an inverter may be used to implement the present invention. However, it should be noted that shifted inverters 50' and 52' are coupled between the supply voltages $V_{DDL}$ and $V_{DDH}$ rather than a ground potential and one of the VDD supply voltage terminals. Although in the illustrated form three distinct voltage terminals for receiving $V_{DDL}$, $V_{DDH}$ and ground potentials are taught, it should be well understood that any three voltage potentials can be used in connection with the present invention.

An output of shifted inverter 50' is connected at node 45' to an input of a shifted inverter 62 which is also connected between supply voltage terminals $V_{DDH}$ and $V_{DDL}$. An output of shifted inverter 62 is connected to an input of a shifted inverter 64 which is also connected between supply terminals $V_{DDH}$ and $V_{DDL}$. An output of shifted inverter 64 is connected to a node 66. An output of shifted inverter 52' is connected to an input of a shifted inverter 68 at node 44'. Shifted inverter 68 is also connected between supply voltage terminals $V_{DDH}$ and $V_{DDL}$. An output of shifted inverter 68 is connected to the output of shifted inverter 64 at node 66 and to an output stage 61. Output stage 61 is formed of p-channel transistors 70 and 72 and n-channel transistors 90 and 92. A gate of p-channel transistor 70 is connected to node 66. Transistor 70 has a source and, in one form, a well region (not shown) connected to voltage terminal $V_{DDH}$. Transistor 70 has a drain connected to a source of p-channel transistor 72. A gate of transistor 72 is connected to a supply voltage terminal for receiving $V_{DDL}$. A well region (not shown) of transistor 72, in one form, may be connected to a bias voltage from a bias circuit (not shown) in order to increase the drive strength of transistor 72. In one form, the bias voltage may be $V_{DDH}$. A drain of transistor 72 is connected to an output terminal 74.

The data input terminal of output buffer 60 is also connected to an input of an inverter 80 having an output connected to an input of an inverter 82. An output of inverter 82 is connected to a gate of a n-channel transistor 94. A drain of transistor 94 is connected to supply voltage terminal $V_{DDL}$, and a source of transistor 94 is connected to a drain of n-channel transistor 96. Transistor 96 has a gate connected to the supply voltage terminal $V_{DDL}$. Transistor 96 also has a source connected to the output terminal 74. An input of an inverter 84 is connected to the data input terminal. Inverter 84 has an output connected to an input of inverter 86, and inverter 86 has an output connected to an input of an inverter 88. Inverter 88 has an output connected to a gate of an n-channel transistor 90. Transistor 90 has a source connected to a ground reference terminal. A drain of transistor 90 is connected to a source of an n-channel transistor 92. Transistor 92 has a gate connected to a supply voltage terminal $V_{DDL}$. A drain of transistor 92 is connected to the output terminal 74.

In operation, output buffer 60, in one form, is intended to operate in an integrated circuit having a supply voltage $V_{DDL}$. The integrated circuit that utilizes output buffer 60 is intended to operate with external circuitry which operates on supply voltages much higher than $V_{DDL}$, such as $V_{DDH}$. The voltage which is the differential between $V_{DDH}$ and ground could destroy the gate oxide of any of the transistors in output buffer 60 if applied across the gate to source/drain junction of any one of the transistors. Therefore, output buffer 60 must function to interface with the $V_{DDH}$ supply in such a way that it can provide an output signal which will be useful with the circuitry using the $V_{DDH}$ supply and yet not damage any of the transistors of output buffer 60. To accomplish this purpose, output buffer 60 limits the maximum gate-to-source/drain voltage across any transistor within output buffer 60 to a maximum of the differential between $V_{DDH}$ and $V_{DDL}$, where $V_{DDH}$ potentials are being driven. Output buffer 60 functions to avoid any $V_{DDH}$-to-ground voltage potentials by using $V_{DDH}$–$V_{DDL}$ voltage potentials, such as previously noted in connection with shifted inverters 50', 52', 62, 64 and 68. Output buffer 60 is implemented as a static design which does not consume any direct current (DC) power.

In operation, assume initially that when power is applied to output buffer 60, the data input terminal is at a voltage of $V_{DDL}$. In response to that voltage input, node 44' is at a voltage of $V_{DDH}$. Additionally, node 45' is at a voltage of $V_{DDL}$. The voltage at node 66 is therefore at $V_{DDL}$ as a result of shifted inverters 52' and 68 complementing the inputted voltage $V_{DDL}$ to place $V_{DDL}$ on node 66. In response to voltage $V_{DDL}$ being on node 66, transistor 70 is made conductive since the source of transistor 70 is at $V_{DDH}$. Transistor 72 is also conductive thereby making the output terminal 74 have a voltage of $V_{DDH}$. In response to the input signal value of $V_{DDL}$ at the data input terminal, the output of inverter 88 is at ground potential since inverters 84, 86, and 88 operate between ground and $V_{DDL}$ potentials. With a ground potential at the gate of transistor 90, transistor 90 is non-conductive.

Now assume that the data input signal transitions from $V_{DDL}$ to ground. In response, the node 44' transitions from $V_{DDH}$ to a voltage between ground and $V_{DDL}$ which will be referred to as an "Intermediate" voltage. Self-timed pulse generation circuit 40' functions to provide a valid output signal at the output of NAND gate 55 until the transition at the data input terminal ripples through the odd number of inverters in the self-timed pulse generation 40'. Thus pulse generation circuit 40' functions as a pulse generator providing a pulse of predetermined duration. In response to the transition at the output of the last series-connected inverter of pulse generation circuit 40', the output of NAND gate 55 transitions in value. The output transition of NAND gate 55 forces node 44' to then change its potential from an Intermediate value to $V_{DDL}$. Before that transition, however, the Intermediate value exists at node 44' long enough, as determined by self-timed pulse generation circuit 40', to allow the output of shifted inverter 50' to transition to the potential of $V_{DDH}$. Once node 44' transitions to $V_{DDL}$ from the Intermediate value, the output of shifted inverter 52' will ensure that node 44' stays at the $V_{DDL}$ potential. In response to the output of shifted inverter 50' changing to $V_{DDH}$, this change ripples through shifted inverters 62 and 64 so that node 66 now becomes $V_{DDH}$. In response to substantially no voltage differential existing between the source and gate of transistor 70, transistor 70 becomes non-conductive. Additionally, in response to a ground potential existing at the data input terminal, inverters 84, 86 and 88 function to place a $V_{DDL}$ potential at the gate of transistor 90. In response, transistor 90 becomes conductive and transistor 92 is also conductive. Therefore, a ground potential is directly connected to the output terminal 74. Transistors 92 and 96 are present in buffer 60 to provide dielectric protection to the gate oxides of transistors 90 and 94, respectively.

Assume now that the data input terminal transitions from ground to $V_{DDL}$. In response, self-timed pulse generation circuit 46' functions to place a potential at node 45' which transitions node 45' from the voltage $V_{DDH}$ to an Intermediate voltage value between ground and $V_{DDL}$. The duration of the Intermediate voltage value at node 45' (the pulse width of the signal at node 45') is a function of the delay of the inverter chain in self-timed pulse generation circuit 46'. The number of inverters in each of self-timed pulse generation circuits 40' and 46' is selected as an odd number only because an odd number is required in the illustrated form to make the logic sense of the input signal properly function with shifted inverters 50' and 52'. Once the transition value of $V_{DDL}$ ripples through the delay chain of self-timed pulse generation circuit 46', the output of NAND gate 58 will transition and therefore make node 45' transition from the Intermediate value to the voltage $V_{DDL}$. In response to the voltage $V_{DDL}$ existing at node 45', the output of shifted inverter 52' will force node 44' to have a value of $V_{DDH}$. In response to the voltage values at nodes 45' and 44', the node 66 value will transition to a value of $V_{DDL}$, making transistor 70 conductive again. However, before this operation occurs, inverters 80 and 82 along with transistors 94 and 96 affect the output terminal 74. Inverters 80 and 82 make transistor 94 conductive. Transistor 96 is also conductive. As a result, output terminal 74 is pulled towards a voltage which is $V_{DDL}$ minus a transistor threshold voltage value of transistor 96. The placing of $V_{DDL}$ at node 74 occurs very quickly via transistors 94 and 96. Shortly thereafter, the change in conduction of transistor 70 reinforces the transition at output terminal 74 and further pulls output terminal 74 from ($V_{DDL}$ minus a transistor threshold voltage value) to $V_{DDH}$. Transistors 94 and 96, along with assistance from inverters 80 and 82, collectively function to assist transistors 70 and 72 in the transition and logic state of output terminal 74. Without the assistance from transistors 94 and 96, transistors 70 and 72 would have to be made larger devices in order to be able to make the transition as quickly as otherwise accomplished with the assistance of transistors 94 and 96.

It should be noted that as a minimum, output buffer 60 may function without using shifted inverter 68 and instead coupling only one output of the cross-coupled inverters to the output stage 61. Shifted inverter 68 improves circuit performance by providing additional drive capability. Also, only the cross coupled shifted inverters 50' and 52' are required for output buffer 60 to function. The use of inverters 62, 64 and 68 provides additional drive for the output stage.

Figure 4:
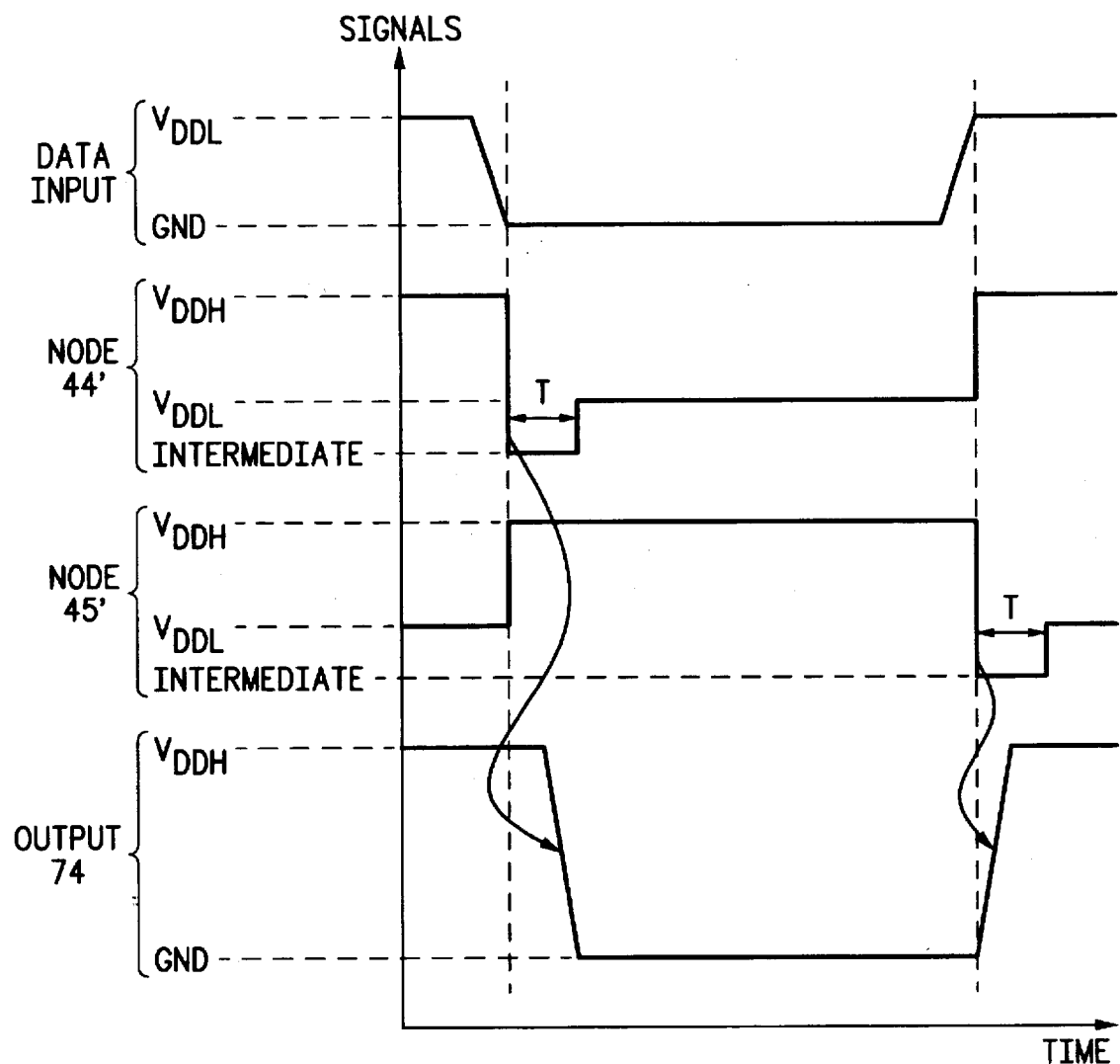
FIG. 4 illustrates in graphical form signals associated with the output buffer of FIG. 3.

Illustrated in FIG. 4 is a timing diagram of signals associated with output buffer 60 of FIG. 3. For illustration purposes, arbitrary logic values of the data input are chosen and the resulting values at node 44', node 45', and output terminal 74 are provided. Although the various voltages of FIG. 4 are illustrated as having constant levels, it should be appreciated that typically some minor variation of the value of each of the voltages will occur due to factors such as noise and temperature. As previously stated, the data input signal potential varies between $V_{DDL}$ and ground. Node 44' and node 45', as previously described in connection with FIG. 3, vary between $V_{DDH}$, an Intermediate voltage value, and $V_{DDL}$ where the Intermediate voltage value is a differential between $V_{DDL}$ and ground. When the data input transitions from $V_{DDL}$ to ground, node 44' transitions also to the Intermediate voltage value. The transition of node 44' turns off transistor 70, and transistors 90 and 92 force the output terminal 74 to transition from $V_{DDH}$ to ground. The time period, Tau (T), that node 44' remains at the Intermediate voltage value is determined by the inverter delay of self-timed pulse generation circuit 40'. Similarly, whenever the data input transitions from ground to $V_{DDL}$, node 45' transitions from $V_{DDH}$ to the Intermediate voltage value. The change to the Intermediate voltage value at node 45' causes the output terminal 74 to transition from a ground value to $V_{DDH}$. Meanwhile, node 44' in response to the data input changing from ground to $V_{DDL}$ changes from $V_{DDL}$ to $V_{DDH}$.

Referring back to FIG. 3, it should be noted that dielectric protection transistors 42' and 48' function to provide electrical charge protection to pulse generation circuits 40' and 46', respectively. Because transistors 42' and 48' each have a gate connected to $V_{DDL}$, each transistor ensures that the outputs of self-timed pulse generation circuits 40' and 46' respectively do not exceed ($V_{DDL}$ minus a transistor threshold voltage) regardless of what voltage occurs at nodes 44' and 45'. The dielectric protection provided herein by transistors 42' and 48' could each instead be implemented with two or more series-connected transistors, each having a gate thereof connected to $V_{DDL}$.

While referring to FIG. 3, it should be noted that in output buffer 60, elements 38', 40', 46'42', 48', 80, 82, 84, 86 and 88 operate only with the lower $V_{DDL}$ voltage. Elements 50', 52', 62, 64, 68, 94 and 96 operate between $V_{DDH}$ and $V_{DDL}$, while elements 70, 72, 90 and 92 function to provide $V_{DDH}$ while connected between $V_{DDH}$ and ground. However, the circuit operation provided ensures that none of the elements 70, 72, 90 and 92 have the full $V_{DDH}$ potential created between a source/drain electrode and a gate electrode. The present invention can therefore ensure transistor integrity when implemented in a semiconductor process not specified to be able to withstand a gate-to-source/drain voltage of $V_{DDH}$ and yet still provide an output voltage of $V_{DDH}$ to a circuit (not shown) which can readily accept and use a higher $V_{DDH}$ supply voltage.

By now, it should be appreciated that there has been provided an improved level shift circuit which has many applications, one of which is as an output buffer. The level shifting provided in FIG. 2 operates on the principle of using a pulse generation circuit in parallel with a cross-coupled pair of inverters. By using pulse generation circuits, a specific duration of a pulse is guaranteed and created to ensure that voltages at nodes 44 and 45 of FIG. 2 remain at a certain potential long enough for shifted inverters 50 and 52 to function to transition their output voltages. The use of the level shift circuit taught herein is most advantageous when utilized in an integrated circuit that has two voltages, whether supply voltages or internal voltages, which significantly vary. When two voltages of differing potentials exist in a circuit, some transistors in the circuit may not be able to utilize both voltages without running the risk of damaging the transistors. Additionally, the present invention may be used in a circuit which functions as both an input/output buffer and not just an output buffer. In such an example, receive circuitry (not shown) is connected to output terminal 74 and output terminal would function to both provide an output voltage having a value of VDDH as well as receive an input voltage of approximately that value or less.

Similarly, the present invention is well suited for an application in an advanced integrated circuit which is going to be used with other discrete integrated circuits having process technologies which allow much higher voltages. The present level shifter taught herein allows a circuit to be implemented with transistors designed to operate reliably only with much lower supply voltage and yet provide an output voltage having a logic value for use at a significantly higher voltage. It should be noted that the present invention provides a static design solution which is significantly different than past circuits which have merely accommodated the ability to interface between a high voltage value and a lower voltage value. The present invention not only allows an interface between such voltage differentials, but actually provides the higher voltage signal from an integrated circuit which is process specified to be safely used only with the lower voltage value. A major advantage of the present invention is the fact that the transistors which use the lower supply voltage value may provide this higher supply voltage value without risking electrical damage to the gate dielectric of the transistors being used to provide the higher supply voltage. Another important aspect of the present invention is that it is a static design and does not consume DC power. The advantage of the static design is provided, in part, by the use of the self-timed pulse generation circuitry.

Many applications of the present invention can be readily seen. For example, the present invention may be used in connection with a clock generator in an integrated circuit wherein a clock generator is operating at a reduced $V_{DD}$ voltage as compared with voltages which are powering the remainder of the circuitry. The present invention can be used at the output stage of the reduced voltage clock generation circuitry to provide clock signals having a higher voltage value to the remainder of the circuitry which is designed for the higher voltage. As a result, a significant power savings may be realized in an integrated circuit which utilizes the level shift circuit taught herein. When a clock circuit utilizing the present invention such as that described herein is used in a microprocessor, a large portion of the power otherwise utilized by the microprocessor is saved by using the present invention. For example, if we assume clock power for a microprocessor is 30% of its total power, and the supply voltage to clock generators is reduced to 75% of the logic power supply, total power is reduced by approximately 15%. It should also be appreciated that the present invention may be implemented using other forms of transistors including bipolar and BiCMOS devices.

While there have been described hereinabove the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A static cross-coupled level shifter circuit that receives an input signal at a first voltage or a second voltage and outputs an output signal at either the second voltage or a third voltage, comprising:
   a first pulse generation circuit for generating a first pulse signal of a first duration;
   a second pulse generation circuit for generating a second pulse signal of a second duration; and
   a pair of cross-coupled inverters, wherein each inverter of the pair of cross-coupled inverters has an output that switches between the second and third voltages, in response to the first and second pulse signals;
   the third voltage having a magnitude greater than a magnitude of the second voltage, the magnitude of the third voltage being large enough to destroy a gate oxide of any of a plurality of transistors used to implement the first and second pulse generation circuits and the pair of cross-coupled inverters and therefore never permitted to exist across a gate oxide of any of the plurality of transistors used to implement the first and second pulse generation circuits and the pair of cross-coupled inverters.

2. The circuit of claim 1, wherein a voltage level of the first pulse signal is a lower potential than the second voltage such that the inverter switches to the third voltage.

3. The circuit of claim 1, further comprising a dielectric protection circuit connected between each of the pulse generation circuits and the pair of cross-coupled inverters.

4. The circuit of claim 1, further comprising an output stage to form an output buffer, wherein one of the outputs of the pair of cross-coupled inverters is coupled to an input of the output stage of the output buffer.

5. The circuit of claim 4, further comprising one or more series-connected inverters receiving at least one output of the pair of cross-coupled inverters, wherein an output of the one or more series connected inverters is an input to the output stage of the output buffer.

6. The circuit of claim 4, further comprising an output signal voltage pull-up stage for selectively pulling up the output signal voltage substantially to the second voltage, thereby assisting the output stage to transition the output signal voltage from the first voltage to the third voltage.

7. The circuit of claim 1, wherein a dielectric breakdown voltage for at least one transistor of the static cross-coupled level shifter circuit is less than a difference between the first and third voltages and is greater than the difference between the second and third voltages.

8. A static cross-coupled level shifter circuit that receives an input signal having a first voltage or a second voltage, and provides an output signal having the second voltage or a third voltage, comprising:
   a first plurality of delay elements connected in series that receives the input signal;
   a first logic gate receiving an output of the first plurality of delay elements and the input signal;
   first dielectric protection circuitry coupled to the output of the first logic gate;
   a second plurality of delay elements connected in series that receives a logical inverse of the input signal;
   a second logic gate receiving an output of the second plurality of delay elements and the logical inverse of the input signal;
   second dielectric protection circuitry coupled to the output of the second logic gate;
   a first pair of series-connected transistors having an input and an output, wherein the input of the first pair of series-connected transistors is connected to the first dielectric protection circuitry; and
   a second pair of series-connected transistors having an input and an output, wherein the input of the second pair of series-connected transistors is connected to the second dielectric protection circuitry;
   wherein the output of the first pair of series-connected transistors is connected to the input of the second pair of series-connected transistors, and the output of the second pair of series-connected transistors is connected to the input of the first pair of series-connected transistors.

9. The circuit of claim 8, wherein a dielectric breakdown voltage for at least one transistor of the static cross-coupled level shifter circuit is less than a difference between the first and third voltages and is greater than the difference between the second and third voltages.

10. The circuit of claim 8 wherein the circuit is comprised of complementary MOS transistors.

11. The circuit of claim 8, wherein the first pair of series-connected transistors includes a first transistor having a first terminal connected to the third voltage, and a second transistor having a first terminal connected to the second terminal of the first transistor and a second terminal connected to the second voltage, and wherein the second pair of series-connected transistors includes a first transistor having a first terminal connected to the third voltage, and a second transistor having a first terminal connected to a second terminal of the first transistor and having a second terminal connected to the second voltage, the first and second transistors of the first pair each having a control terminal connected together and to the second terminal of the first transistor of the second pair of series-connected transistors, the first and second transistors of the second pair each having a control terminal connected together and to the second terminal of the first terminal of the first pair of series-connected transistors.

12. A method for generating a voltage level shifted output in a level shifting circuit, the method comprising the steps of:
   receiving an input signal having a first voltage or a second voltage;
   voltage level shifting the input signal with circuitry having transistors with control electrodes of a first oxide thickness to an output signal varying between the second voltage and a third voltage, a differential between the first voltage and third voltage being large enough to damage or destroy the control electrodes of the first oxide thickness;
   wherein there are no current conduction paths in the level shifting circuit that would permit current conduction between any of the first, second and third voltages during circuit operation when no logic state transitions are occurring.

13. The method according to claim 12, wherein the step of voltage level shifting further comprises the steps of:
   generating pulses of an intermediate voltage between the first and second voltages, in response to a change in the input signal;
   applying the pulses of the intermediate voltage to an input and output of a pair of cross-coupled shifted inverters; and
   selectively driving the cross-coupled shifted inverters with the pulses, wherein the cross-coupled shifted inverters generate a level shifted output signal varying between the second voltage and the third voltage.

14. The method according to claim 12 further comprising the steps of:

performing a second voltage level shifting of the output signal with additional circuitry having transistors with control electrodes of the first oxide thickness, the second voltage level shifting providing a buffered output signal which varies between the first voltage and the third voltage.

* * * * *